United States Patent [19]

Sano

[11] Patent Number: 5,153,522
[45] Date of Patent: Oct. 6, 1992

[54] SOLENOID VALVE FAILURE DETECTING APPARATUS

[75] Inventor: Kunihiko Sano, Shizuoka, Japan

[73] Assignee: Jatco Corporation, Japan

[21] Appl. No.: 723,226

[22] Filed: Jun. 28, 1991

[30] Foreign Application Priority Data

Jul. 6, 1990 [JP] Japan .............................. 2-72399[U]

[51] Int. Cl.$^5$ ...................... G01R 31/06; G01R 31/32
[52] U.S. Cl. ..................................... 324/546; 324/418; 340/644
[58] Field of Search ............... 324/418, 546, 422, 423; 340/644

[56] References Cited

U.S. PATENT DOCUMENTS 4,870,364  9/1989  Trox et al. ..................... 340/644

FOREIGN PATENT DOCUMENTS

| 0080064 | 6/1980 | Japan | 324/418 |
| 0199963 | 12/1982 | Japan | 324/418 |
| 60-40856 | 3/1985 | Japan . | |
| 2194347 | 3/1988 | United Kingdom | 324/418 |

Primary Examiner—Jack B. Harvey
Assistant Examiner—Maura K. Regan
Attorney, Agent, or Firm—Ronald P. Kananen

[57] ABSTRACT

An apparatus for detecting a failure in a solenoid valve having an electrical winding electromagnetically coupled with a plunger. The failure detecting apparatus comprises a current sensor sensitive to a current through the electrical winding for producing a signal indicative of a sensed winding current. Changes in the sensed winding current indication signal with time are monitored to provide a failure signal which indicates a failure in the solenoid valve when no inflection point exists in the change of the sensed winding current indication signal for a predetermined period of time after power is supplied to the electrical winding.

6 Claims, 3 Drawing Sheets

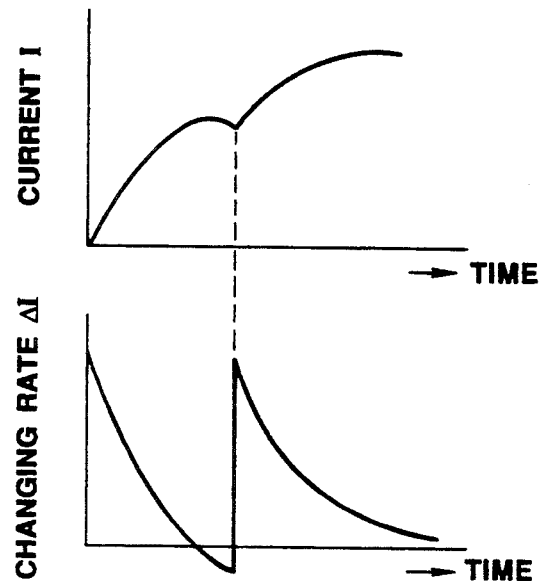
FIG.2A
FIG.2B
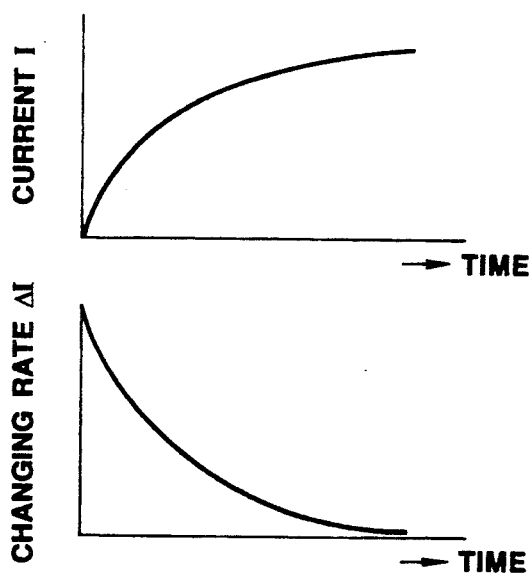
FIG.3A
FIG.3B

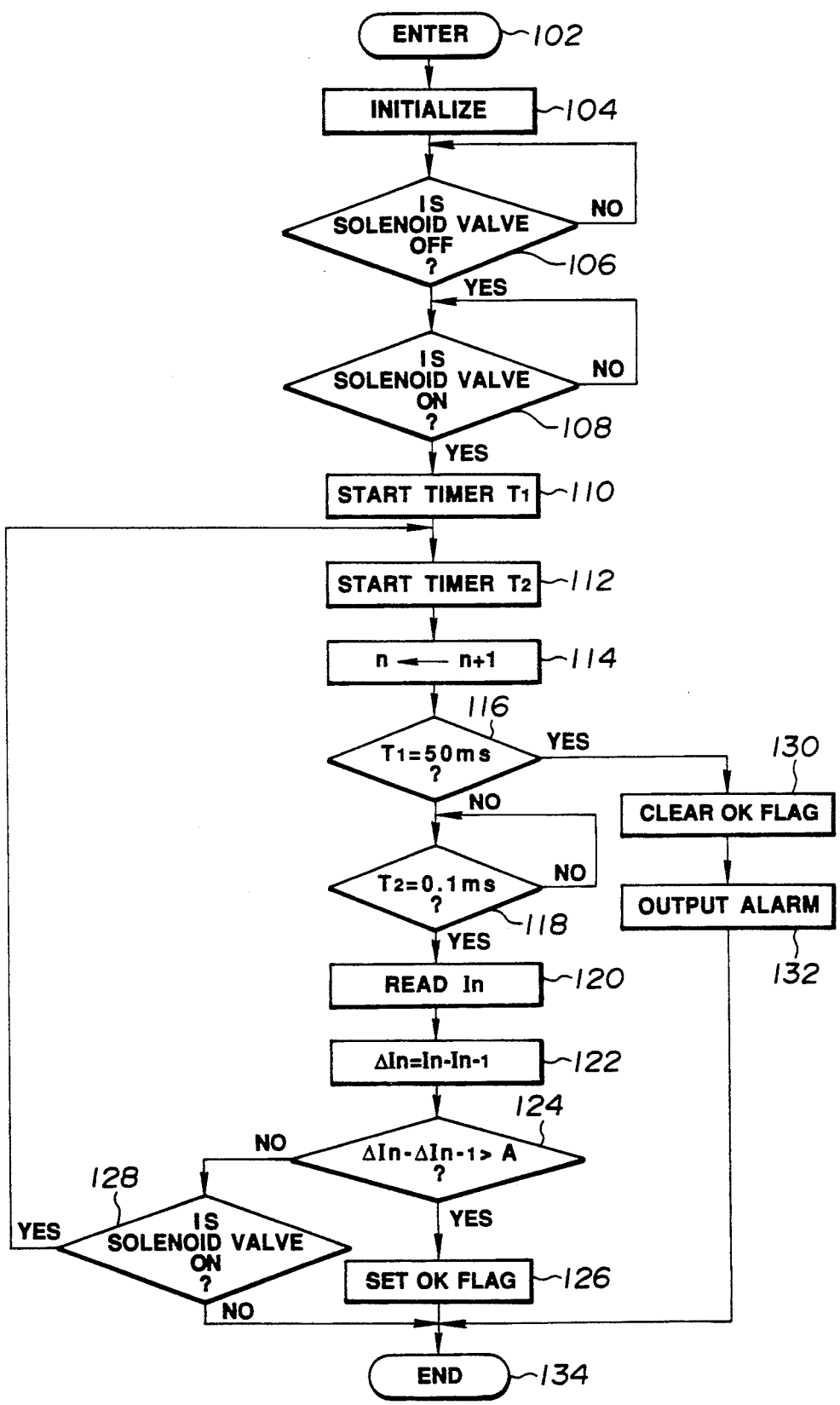

SOLENOID VALVE FAILURE DETECTING APPARATUS

BACKGROUND OF THE INVENTION

This invention relates to an apparatus for detecting a failure in a solenoid valve having an electrical winding electromagnetically coupled with a plunger.

For example, Japanese Patent Kokai No. 60-40856 discloses a conventional apparatus for detecting a failure in a oil pressure control unit. The conventional apparatus employs an oil pressure sensor provided in an oil conduit connected to the output side of a shift valve. The shift valve is judged to be subject to a failure when the sensed oil pressure is different from the oil pressure to be sensed when the shift valve is operating in order. However, the conventional apparatus requires a number of oil pressure sensors to check all of the shift valves, resulting an expensive and space-consuming failure detecting apparatus.

SUMMARY OF THE INVENTION

Therefore, a main object of the invention is to provide an inexpensive valve failure detecting apparatus which consumes far less space.

There is provided, in accordance with the invention, an apparatus for detecting a failure in a solenoid valve having an electrical winding electromagnetically coupled with a plunger. The apparatus comprises first means for supplying power to the electrical winding, second means sensitive to a current through the electrical winding for producing a signal indicative of a sensed winding current, and third means for monitoring changes in the sensed winding current indication signal with time to provide a failure signal to indicate a failure in the solenoid valve when no inflection point exists in the change of the sensed winding current indication signal for a predetermined period of time after the power is supplied to the electrical winding.

BRIEF DESCRIPTION OF THE DRAWINGS

This invention will be described in greater detail by reference to the following description taken in connection with the accompanying drawings, in which:

FIGS. 2A, 2B, 3A and 3B are graphs used in explaining the principles of the invention; and FIG. 4 is a flow diagram showing the programming of the digital computer as it is used to detect a failure in the solenoid valve.

DETAILED DESCRIPTION OF THE INVENTION

Figure 1:
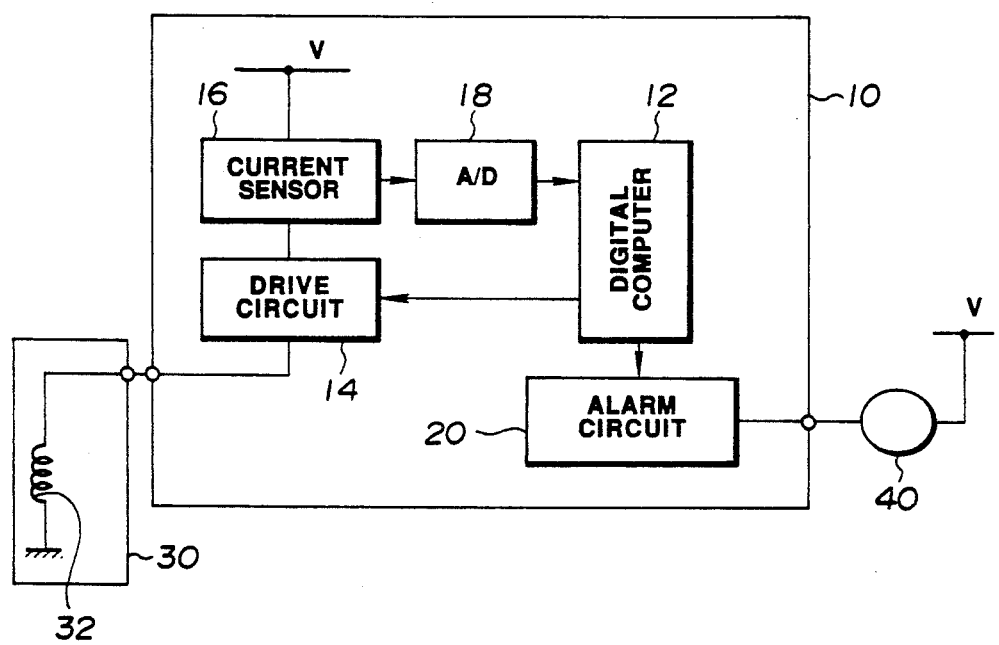
FIG. 1 is a schematic diagram showing one embodiment of a solenoid valve failure detecting apparatus made in accordance with the invention.

With reference to the drawings, and in particular to FIG. 1, there is shown a schematic diagram of a solenoid valve failure detecting apparatus embodying the invention. The failure detecting apparatus may share a control unit, generally designated by the numeral 10, with an engine and/or transmission control unit. The control unit 10 includes a digital computer 12, a drive circuit 14, a current sensor 16, an analog-to-digital converter 18, and an alarm circuit 20. The digital computer includes a central processing unit (CPU), a random access memory (RAM), and a read only memory (ROM). The central processing unit communicates with the rest of the computer via a data bus. The read only memory contains the program for operating the central processing unit. The drive circuit 14 has an output connected to a solenoid valve 30 which includes an electrical winding 32 electromagnetically coupled with a plunger (not shown). The drive circuit 14 operates on a command from the digital computer 12 to flow electric current within the electrical winding 32 so as to move the plunger. The current sensor 16 senses the electrical current through the electrical winding 32 and produces an analog signal indicative of the sensed electric current. The A/D converter 18 receives the analog signal from the current sensor 16 and converts it into digital form for application to the central processing unit. The central processing unit produces a command causing the alarm circuit 20 to actuate an alarm lamp 40 so as to provide a visual indication in the event of a failure in the solenoid valve 30.

The principles on which a failure in the solenoid valve 30 is detected according to the invention will be described with reference to FIGS. 2 and 3. When a voltage E is applied to the electrical winding 32, the current I through the electrical winding 32 is $$I=(E/R)\{1\ominus e^{-(R/L)t}\}$$

where R is the resistance of the electrical winding 32, L is the self-inductance of the electrical winding 32, and t is the time elapsed after the voltage E is applied to the electrical winding 32.

It is first assumed that the solenoid valve 30 is in order. When the voltage E is applied to the electrical winding 32, the plunger moves to change the self-inductance of the electrical winding 32, causing a temporary drop in the current I, as shown in FIG. 2A. The current I increases again after the plunger stops moving. As a result, the rate ΔI of change of the current I changes in such a manner as to change its sign, as shown in FIG. 2B. If the plunger sticks, the self-inductance of the electrical winding 32 will remain constant and the current I will change smoothly, as shown in FIG. 3A. As a result, the rate ΔI of change of the current I has no point of inflection, as shown in FIG. 3B. Accordingly, it is possible to detect a sticking condition in the solenoid valve 30 by detecting the inflection point at which the sign of the rate ΔI of change of the current I changes.

FIG. 4 is a flow diagram of the programming of the digital computer as it is used to detect a failure in the solenoid valve 30. The computer program is entered at the point 102. At the point 104 in the program, the counter, timer, flag and memory sections used in this program are initialized. At the point 106 in the program, a determination is made as to whether or not the solenoid valve 30 is deenergized. If the answer to this question is "yes", then the program proceeds to the point 108. Otherwise, the program is returned to the point 106. At the point 108 in the program, a determination is made as to whether or not the solenoid valve 30 is energized. If the answer to this question is "yes", then it means that the solenoid valve 30 changes from its deenergized condition to its energized condition and the program proceeds to the point 110. Otherwise, the program is returned to the point 108.

At the point 110 in the program, a first timer T1 is started. The program then proceeds to the point 112 where a second timer T2 is cleared and started. The program then proceeds to the point 114 where a counter is incremented by one step. This counter accumulates a count indicating the number of times the program proceeds to this point. At the point 116 in the program, a determination is made as to whether or not the first timer T1 is timed out. If the answer to this question is "no", then the program proceeds to another determination step the point 118. This determination is as to whether or not the second timer T2 is timed out. If the answer to this question is "no", then the program is returned to the point 118. Otherwise, it means that 0.1 ms has been elapsed and the program proceeds to the point 120 where the current In through the electrical winding 32 is read into the computer memory. Thus, the current I through the electrical winding 32 is sampled or read into the computer memory at uniform intervals of time of 0.1 ms. The program then proceeds to the point 122 where the central processing unit calculates the rate $\Delta$In of change of the current I through the electrical winding 32 by subtracting the last value In-1 of the current I from the new value In of the current I.

At the point 124 in the program, a determination is made as to whether or not a difference of the last current changing rate value $\Delta$In-1 from the new current changing rate value $\Delta$In is greater than a predetermined value A. The value A is zero or a positive value. If the answer to this question is "yes", then it means that the plunger moves to produce an inflection point in the change of the current I through the electrical winding 32 and the program proceeds to the point 126 where the OK flag is set to indicate that the solenoid valve 30 is in order. Following this, the program proceeds to the end point 134. If the answer to the question inputted at the point 124 is "no", then it means that no inflection point is found and the program proceeds to another determination point 128. This determination is as to whether or not the solenoid valve 30 is energized. If the answer to this question is "yes", then the program is returned to the point 112. Otherwise, the program proceeds to the end point 134.

If the answer to the question inputted at the point 116 is "yes", then it means 50 ms has been elapsed with no inflection point being found in the change of the current I through the electrical winding 32 and the program proceeds to the point 130 where the OK flag is cleared. The program then proceeds to the point 132 where a command is produced to actuate the alarm lamp 40 so as to provide an indication that the solenoid valve 30 is subject to such a failure that its plunger sticks. Following this, the program proceeds to the end point 134.

According to the invention, the failure detecting apparatus detects a sticking condition in the solenoid valve 30 based upon the fashion in which the sensed winding current signal changes. The failure detecting apparatus can share a failure detecting unit with an engine and/or transmission control unit. It is, therefore, possible to provide an inexpensive valve failure detecting apparatus which consumes far less space.

The failure detecting apparatus can be used to detect a stick condition of a valve spool drivingly connected to the plunger of the solenoid valve 30.

Although this invention has been described in conjunction with a specific embodiment thereof, it is evident that many alternatives, modification and variations will be apparent to those skilled in the art. Accordingly, it is intended to embrace all alternatives, modification and variations that fall within the scope of the appended claims.

What is claimed is:

1. An apparatus for detecting a failure in a solenoid valve having an electrical winding electromagnetically coupled with a plunger, comprising:

first means sensitive for supplying power to the electrical winding;

second means sensitive to a current through the electrical winding for producing a signal indicative of a sensed winding current; and third means for monitoring changes in the sensed winding current indication signal with time to provide a failure signal indicating that the plunger is sticking in the solenoid valve when no inflection point exists in the change of the sensed winding current indication signal for a predetermined period of time after the power is supplied to the electrical winding.

2. The solenoid valve failure detecting apparatus as claimed in claim 1, wherein the third means includes means for calculating a rate of change of the sensed winding current indication signal, wherein the calculated changing rate has a positive or negative sign, and means for producing the failure signal when the sign of the calculated changing rate is not changed for the predetermined period of time after the power is supplied to the electrical winding.

3. An apparatus for detecting a plunger-sticking condition in a solenoid valve having an electrical winding electromagnetically coupled with a plunger, comprising:

a current sensor sensing current through said electrical winding for providing a signal indicative of sensed winding current in said solenoid valve;

a drive circuit operable upon command for providing electrical current to the electrical winding in the solenoid;

computer means for receiving said sensed winding current indicative signal, for commanding said drive circuit to flow electrical current to said electrical winding, said computer means providing an output signal indicative of a plunger-sticking condition determined by said sensed winding current indicative signal, said computer means detecting whether an inflection point exists in said sensed winding current indicative signal within a predetermined time after electrical current is provided from said drive circuit, said inflection point being indicative of a normal operation without a plunger-sticking condition, the absence of said inflection point indicating a plunger-sticking condition, and providing an output signal representative of the status of said inflection point.

4. The apparatus as set forth in claim 3, wherein said computer means includes means for timing a period during which said winding current is sensed and means for sampling said winding current.

5. The apparatus as set forth in claim 4 wherein said computer means further includes means for calculating the rate of change of the sampled winding current and determining whether the inflection point exists.

6. The apparatus as set forth in claim 5 wherein said calculating means includes means for subtracting a calculated value of the rate of change of the sampled winding current from a new calculated value of the rate of change of the sampled winding current, and determining whether a difference is greater than a predetermined value which is zero or a positive value wherein said plunger is not sticking, or less than zero, thus indicating a plunger-sticking condition.

* * * * *